United States Patent [19]

Beneking

[11] 4,212,022
[45] Jul. 8, 1980

[54] FIELD EFFECT TRANSISTOR WITH GATE AND DRAIN ELECTRODES ON THE SIDE SURFACE OF A MESA

[75] Inventor: Heinz Beneking, Aachen, Fed. Rep. of Germany

[73] Assignee: Licentia Patent-Verwaltungs-G.m.b.H., Fed. Rep. of Germany

[21] Appl. No.: 584,340

[22] Filed: Jun. 6, 1975

Related U.S. Application Data

[63] Continuation-in-part of Ser. No. 464,622, Apr. 26, 1974, abandoned.

[30] Foreign Application Priority Data

Sep. 18, 1974 [DE] Fed. Rep. of Germany ....... 2444489
Apr. 30, 1973 [DE] Fed. Rep. of Germany ....... 2321895

[51] Int. Cl.² ...................... H01L 29/80; H01L 29/64; H01L 29/06
[52] U.S. Cl. ........................................ 357/22; 357/56; 357/15
[58] Field of Search ........................... 357/4, 15, 22, 56

[56] References Cited

U.S. PATENT DOCUMENTS

| | | | |
|---|---|---|---|
| 3,114,867 | 12/1963 | Szekely | 357/22 |
| 3,609,477 | 9/1971 | Drangeid et al. | 357/22 |
| 3,761,785 | 9/1973 | Pruniaux | 357/22 |
| 3,906,541 | 9/1975 | Goronkin | 357/22 |
| 3,920,861 | 11/1975 | Dean | 357/22 |

OTHER PUBLICATIONS

Statz "Fabricating Field Effect Transistors" IBM Tech. Disclosure Bulletin vol. 11, (9/68) p. 397.
DeWitt "Field Effect Transistor" IBM Tech. Disclosure Bulletin vol. 9, (6/66) p. 102.
Tuyl et al., "High-Speed Integrated Logic with GaAs Mesfets" IEEE J. Solid-State Circuits vol. 50-9, (10/74) pp. 269-276.
Zuleeg et al., "A Thin-Film Space-Charge Limited Triode" Proc. IEEE (9/66) pp. 1197-1198.
Drangeid "High-Speed Field-Effect Structure" IBM Technical Disclosure Bulletin vol. 11, (8/68) pp. 332-333.

*Primary Examiner*—Gene M. Munson
*Attorney, Agent, or Firm*—Spencer & Kaye

[57] ABSTRACT

A semiconductor device including a semiconductor body having at least one ohmic electrode and at least one blocking electrode, wherein an ohmic electrode or a blocking electrode is disposed on the side surface of the semiconductor body and wherein in the case where an ohmic electrode is disposed on the side surface, the ohmic electrode has adjacent to it a blocking electrode which is on a major surface of the semiconductor body and, in the case where a blocking electrode is disposed on the side surface, the blocking electrode has adjacent to it an ohmic electrode which is on the major surface.

3 Claims, 6 Drawing Figures

FIELD EFFECT TRANSISTOR WITH GATE AND DRAIN ELECTRODES ON THE SIDE SURFACE OF A MESA

CROSS REFERENCE TO RELATED APPLICATION

This application is a continuation-in-part of applicant's copending U.S. patent application Ser. No. 464,622, filed Apr. 26th, 1974 now abandoned.

BACKGROUND OF THE INVENTION

The present invention relates to a semiconductor arrangement having one or a plurality of electrodes disposed on one major surface of a semiconductor body, and with the arrangement including at least one ohmic electrode and at least one blocking, i.e., rectifying, electrode.

High frequency components are known to be produced either according to the coaxial technique or to the lateral technique. For integration purposes and mainly for coupling ultra high frequency components to a stripline, the lateral arrangement is substantially more favorable than the coaxial arrangement. However, lateral devices, which are generally produced according to the planar technique, have the significant drawback that they exhibit ohmic path resistances which are relatively high and which have a negative effect on the frequency limits.

SUMMARY OF THE INVENTION

It is the object of the present invention to provide a semiconductor arrangement which is suitable for use at very high frequencies and which can be produced with the techniques of the modern semiconductor art.

This is accomplished according to the present invention in that in a semiconductor device having a semiconductor body of one conductivity type an ohmic electrode, and a blocking electrode, one of the electrodes is disposed on the side surface of the semiconductor body and the other electrode is disposed adjacent to the one electrode on the major surface of the semiconductor body. That is, in the case where the ohmic electrode is disposed on the side surface of the semiconductor body, a blocking electrode is disposed on the major surface adjacent this ohmic electrode and in the case where the blocking electrode is disposed on the side surface, an ohmic electrode is disposed on the major surface adjacent this blocking electrode.

An ohmic electrode is understood to mean a metal contact electrode or a highly doped, i.e., low resistance, semiconductor zone which contacts the semiconductor body. A metal electrode or a lead is generally additionally attached to this low resistance semiconductor zone. A blocking electrode is understood to mean a Schottky contact or a pn-junction with one of the semiconductor zones forming the pn junction being contacted by an ohmic electrode.

The term "major surface" of a semiconductor body is generally encountered in disc-shaped semiconductor bodies. A disc-shaped semiconductor body is known to have two oppositely disposed major surfaces and one or more side surfaces the height of which is known to be less than the lateral dimensions of the semiconductor wafer so that the semiconductor wafer is very thin compared to its lateral dimensions. However, the present invention is not limited to semiconductor wafers, but can just as well be used for any desired shape of semiconductor bodies. If the dimensions of the side surfaces of the semiconductor body lie in the order of magnitude of the dimensions of the major surfaces, the term "major surface" is understood to mean the upper or under side of the semiconductor body. In semiconductor arrangements according to the present invention, however, the wafer technique, i.e., the use of thin semiconductor layers, is preferred, particularly since in semiconductor arrangements according to the invention which have a thicker semiconductor body, the active region is limited to the surface region and a significant portion of the semiconductor body serves merely as the substrate.

The electrode on the side surface (side surface electrode) and the electrode on the major surface of the semiconductor body adjacent thereto (major surface electrode) are preferably arranged to be as close together as possible, the lower limit for the distance between the two juxtaposed electrodes being that distance, however, at which the barrier layer of the blocking or rectifying electrode will not yet extend to the adjacent ohmic electrode.

In a semiconductor arrangement according to the invention it is also possible of course to provide a plurality of side surface electrodes as well as a plurality of major surface electrodes. In such case, the conditions required by the invention, particularly with respect to spacing, are then met between all of the associated side surface electrodes and major surface electrodes.

According to one embodiment of the invention, the semiconductor body is given a mesa shape at least in the region of the side surface electrode. This shape is recommended, in particular, if a thicker semiconductor body is employed. In such a semiconductor arrangement, the major surface electrode is disposed on the top surface of the mesa and the side surface electrode is disposed on the slope at the side of the mesa. In order to have available a larger surface area for contacting by the side surface electrode or electrodes, it is recommended, if the mesa arrangement is contemplated, to have the electrode on the slope of the mesa also extend to the horizontal portion of the mesa substrate.

According to another embodiment of the invention, the semiconductor body is an expitaxial layer which has been applied to a substrate. The epitaxial layer is preferably provided with recesses or openings in such a manner that the side surface electrode disposed on the side surface of the epitaxial layer can also extend to the upper surface of the substrate. Such a configuration also permits easier contacting of the side surface electrode disposed on the side surface of the epitaxial layer. The epitaxial layer preferably has a thickness of no more than $10\mu$. For ultra high frequency semiconductor devices, however, it is advisable to make the epitaxial layer less than $1\mu$ thick. The substrate onto which the epitaxial layer is applied may be formed from either a semiconductor material or a nonsemiconductor material, such as spinel, for example.

DETAILED DESCRIPTION OF THE PREFERRED EMBODIMENTS

Figure 1:
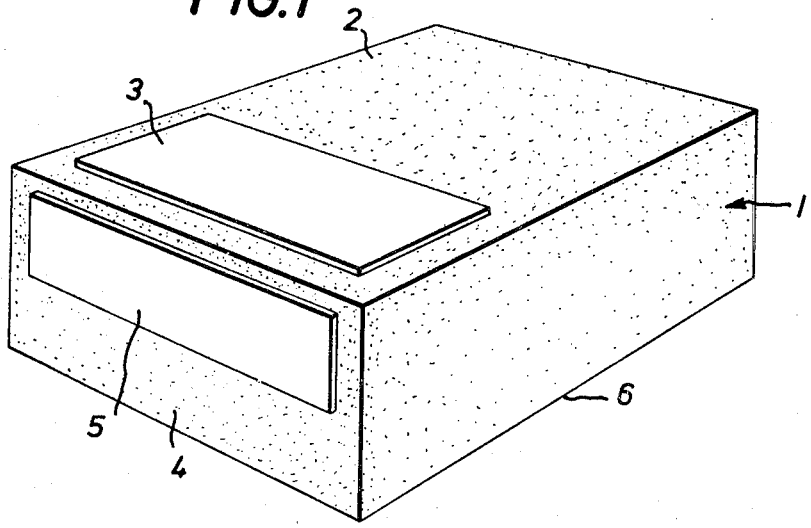
FIG. 1 is an isometric view of a basic device according to the invention.

Referring now to FIG. 1, there is shown the basic device according to the invention which includes a semiconductor body 1 of one conductivity type having a major surface electrode 3 on its major surface 2 and a side surface electrode 5 on its side surface 4. If the semiconductor body 1 has a circular cross section, for example, only one side surface 4 will exist. If, however, the semiconductor body 1 has a rectangular cross section as shown, such a semiconductor body is known to have four side surfaces. In this case the side surface electrode 5 is disposed on one of these side surfaces. The semiconductor body 1 of FIG. 1 includes, in addition to the one major surface 2 on the upper side, a second major surface 6 on the underside which surface is parallel to the major surface 2.

If in the semiconductor arrangement of FIG. 1, which can be utilized, for example, as a diode, the major surface electrode 3 is an ohmic electrode, then the side surface electrode 5 is a blocking electrode. If, however, in the arrangement of FIG. 1 the major surface electrode 3 is a blocking electrode, then, according to the invention, the side surface electrode 5 is an ohmic electrode. As mentioned above, a blocking electrode is understood to mean a Schottky contact or a pn-junction which is formed between the semiconductor body and an opposite conductivity type region and has an ohmic electrode attached to its opposite conductivity type region. According to the present invention, both electrodes 3 and 5 are arranged as closely together as possible for high frequency arrangements. However, the distance between these two electrodes must not be so small that the barrier layer of the blocking electrode extends to and contacts the adjacent ohmic electrode.

The present invention will be explained in detail below for several embodiments of field effect transistors.

Figure 2:
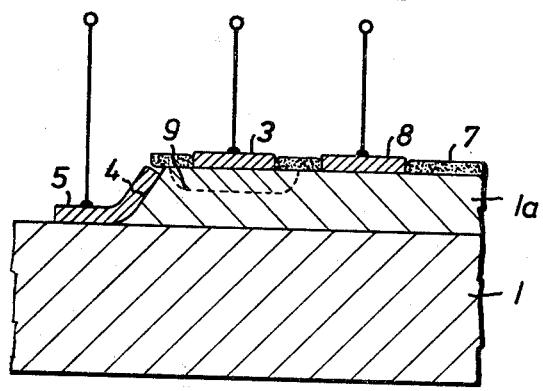
FIGS. 2–4 and 6 are cross-sectional views of various embodiments of field effect transistors according to the invention.

The field effect transistor of FIG. 2 includes a semiconductor substrate 1, for example of semi-insulating GaAs. On this substrate 1 there is, for example, an n-conductive epitaxial layer 1a, which has a thickness, for example, of from 0.3 to 0.5μ. The impurity concentration of the epitaxial layer lies, for example, in the order of magnitude of $10^{16}$ atoms per cm$^3$. As shown, the epitaxial layer 1a does not extend over the entire surface of the substrate 1 but rather has a portion thereof removed, for example, by etching, in order to form a sloping side surface 4. Applied to the sloping side surface 4 is an ohmic source electrode 5 which is the source electrode of the transistor and can also extend, as shown, to the upper surface of semi-insulating substrate 1. In the immediate vicinity of sloping side surface 4, the control electrode 3 of the field effect transistor is disposed on the major surface of the epitaxial layer 1a. The control electrode 3 in the illustrated embodiment is a Schottky contact. Likewise disposed on the major surface of the epitaxial layer 1a are an insulating layer 7, for example of silicon dioxide, and an ohmic contact 8 which serves as the drain electrode of the transistor. The current flowing between the source and drain electrodes 5 and 8 is influenced to a greater or lesser degree, depending on the voltage applied to the control electrode 3, by the space charge zone 9 which emanates from the barrier layer. The lateral spacing between the control electrode and the drain electrode is 1μ, for example.

During the production of the field effect transistor of FIG. 2 the insulating layer 7 disposed on the major surface of epitaxial layer 1a serves as an etching mask when the portion of the epitaxial layer 1a is removed to produce the sloping side surface 4 and expose the surface of the substrate 1. That is, the epitaxial layer 1a is initially applied over the entire surface of the substrate 1 and the surface of the epitaxial layer is in turn covered with the layer of insulating material. Then the insulating layer 7 is removed above the region of the epitaxial layer which is to be removed and the epitaxial layer is etched via the openings in the insulating layer 7 to form the lateral slope or side surface 4 in the epitaxial layer. It has been found to be advantageous to somewhat underetch the insulating or masking layer during the removal of the epitaxial layer 1a and to also utilize this underetched mask as a vapor-deposition mask during the production of the electrode 5 which is to be attached to the sloping side surface 4. In this way, a clean separation is obtained between the electrode 5 disposed on the side surface 4 and the adjacent electrode 3 disposed on the major surface of the epitaxial layer 1a. In order to form the electrodes 3 and 8, openings are formed in the insulating layer 7 after the etching process, and then the electrodes 3 and 8 are formed in a conventional manner.

Figure 3:
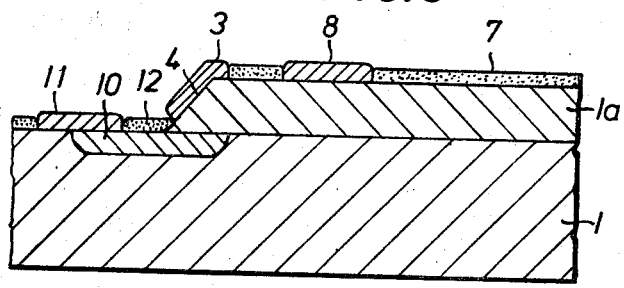

According to the embodiment of FIG. 3 a highly doped zone 10 is formed in a limited area in the surface of the substrate 1 before the epitaxial layer 1a is deposited. This zone 10, which forms the source electrode of the field effect transistor is of the same conductivity type as the epitaxial layer 1a, is n+ conductive if the epitaxial layer 1a is n-conductive and has an impurity concentration of about $10^{19}$ to $10^{20}$ atoms per cm$^3$. After formation of zone 10 for example by diffusion, the n-conductive epitaxial layer 1a is deposited onto the entire surface of the substrate and is then partially removed in the manner described above with respect to FIG. 2 to produce the sloping side surface 4. Care must be taken that sloping side surface 4 is disposed above the zone 10 or in the immediate vicinity of the zone 10. In the embodiment of FIG. 3 the zone 10 extends to both sides of sloping side surface 4. This has the advantage that the source zone 10 can be easily electrically connected via an ohmic conductive path 11. In this case, the control electrode 3 must be disposed only on the sloping side surface 4 in order to prevent a short-circuit between the source and control electrodes. For this purpose, the junction between sloping side surface 4 and the zone 10 (which constitutes the source electrode of the transistor) is preferably covered with an insulating layer 12. The drain electrode 8 is disposed on the major surface of the epitaxial layer 1a in the immediate vicinity of sloping side surface 4. The drain electrode 8 is an ohmic metal contact while the control electrode 3 is a Schottky contact, for example. The space charge zone emanating from the Schottky contact upon the presence of a control voltage influences the current flowing between the drain and source electrodes in the desired manner. The device shown in FIG. 3 with the exception of the position of the control electrode and its relationship to the position of the drain electrode is fully described in applicant's above identified patent application.

Figure 4:
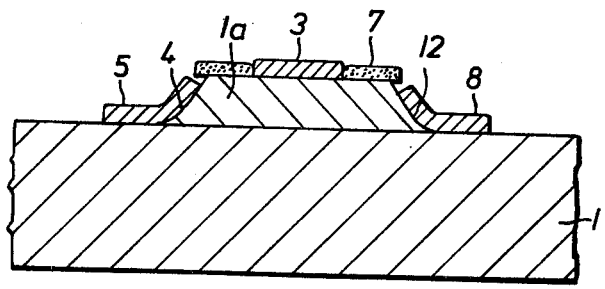

FIG. 4 shows a further embodiment which differs from the embodiment of FIG. 2 only in that the drain electrode 8 is disposed on a further sloping side surface 12. That is, the semiconductor body has a mesa shape and only the control electrode 3 is disposed on the major surface of epitaxial layer 1a. By arranging the drain and source electrodes on opposite side surfaces of the epitaxial layer, i.e., on opposite sides of the mesa, it is possible to greatly reduce the path resistances as well as the residual voltages. The width of the epitaxial layer is substantially determined only by the expanse of the control electrode 3 disposed on the epitaxial layer. Since the control electrode is here also disposed between the drain electrode 8 and the source electrode 5, in this embodiment the current flowing between the drain and source electrodes can likewise be easily influenced by the space charge zone emanating from the control electrode 3.

A semiconductor arrangement according to the invention is suitable, for example, for use with striplines. In this case, the semiconductor arrangement is preferably inserted into the stripline without a housing.

Figure 5:
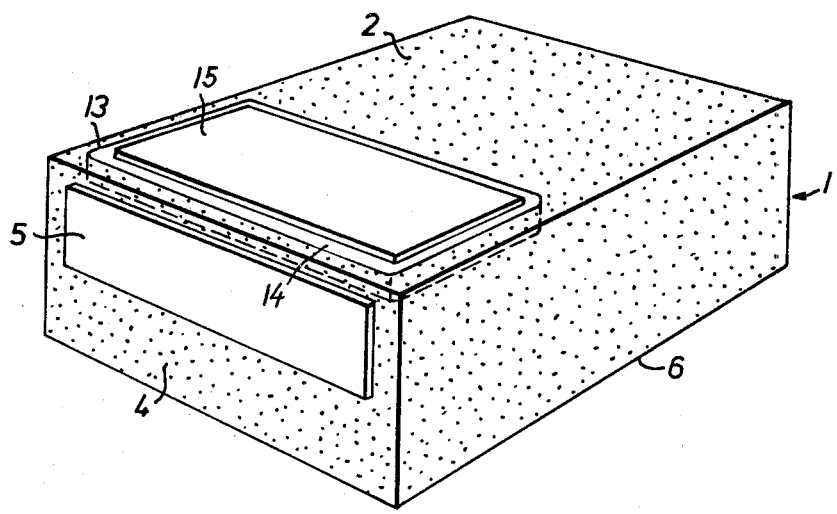
FIG. 5 is an isometric view of a modified version of the basic device according to the invention.

The device of FIG. 5 shows a pn-junction 13 in place of a metal semiconductor contact for providing the rectifying junction. A semiconductor zone 14 is brought into one main surface of the semiconductor body. The conductivity type of the semiconductor zone 14 is opposite to the conductivity type of the semiconductor body 1. On the semiconductor body an ohmic contact 15 is provided for contacting the semiconductor zone 14. On the side surface of the semiconductor body of FIG. 5 there is an ohmic electrode 5.

Figure 6:
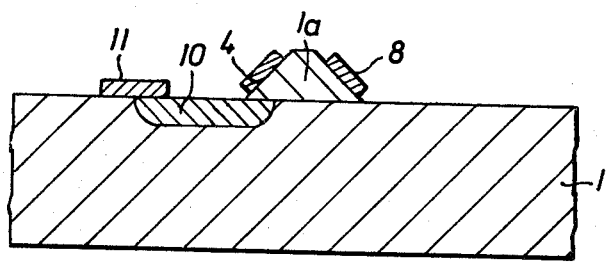

FIG. 6 shows a field effect transistor with a gate electrode 4 and a drain electrode 8 on the side surface of the semiconductor body.

It will be understood that the above description of the present invention is susceptible to various modifications, changes and adaptations and the same are intended to be comprehended within the meaning and range of equivalents of the appended claims.

What is claimed is:

1. In a semiconductor device including a semiconductor body of a first conductivity type, an ohmic electrode and a blocking electrode for said semiconductor body with one of said electrodes being disposed on the side surface of said semiconductor body and the other of said electrodes being disposed adjacent to said one electrode and on a major surface of said semiconductor body the improvement wherein: said device is a field effect transistor having a source electrode, a drain electrode and a control electrode contacting said semiconductor body with said control electrode being disposed between said source and drain electrodes; said semiconductor body is a thin semiconductor layer of uniform conductivity type and forms the controllable channel region of said transistor; said source and control electrodes constitute said ohmic and said blocking electrodes respectively and said drain electrode is the same type electrode as said source electrode; said control electrode and said drain electrode are disposed on the side surface of the semiconductor body; and said source electrode is disposed on the major surface of the semiconductor body in the immediate vicinity of said control electrode.

2. A field effect transistor as defined in claim 1 wherein: said semiconductor layer is formed on a portion of the surface of a highly resistive substrate with said major surface of said semiconductor layer directly contacting said surface of said substrate, the side surface of said semiconductor layer having at least one inclined side surface which extends from said surface of said substrate to a second major surface of said semiconductor layer opposite said major surface directly contacting said surface of said substrate; said source electrode comprises a region of the same conductivity type as said semiconductor body formed in said surface of said substrate and extending only partially below said semiconductor layer; said control electrode is disposed on the side surface of said semiconductor body which contacts said region; and said drain electrode is disposed on a side surface of said semiconductor body opposite that on which said control electrode is disposed.

3. A field effect transistor as defined in claim 2 wherein said semiconductor body is mesa shaped.

* * * * *